(12) United States Patent
Lee et al.

(10) Patent No.: US 7,393,700 B2
(45) Date of Patent: Jul. 1, 2008

(54) LOW TEMPERATURE METHODS OF ETCHING SEMICONDUCTOR SUBSTRATES

(75) Inventors: Sun-Ghil Lee, Gyeonggi-do (KR);
Yu-Gyun Shin, Gyeonggi-do (KR);
Jong-Wook Lee, Gyeonggi-do (KR);
Deok-Hyung Lee, Gyeonggi-do (KR);
In-Soo Jung, Gyeonggi-do (KR);
Young-Eun Lee, Gyeonggi-do (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 299 days.

(21) Appl. No.: 11/208,490

(22) Filed: Aug. 22, 2005

(65) Prior Publication Data

US 2006/0057821 A1 Mar. 16, 2006

(30) Foreign Application Priority Data

Aug. 23, 2004 (KR) .................. 10-2004-0066530

(51) Int. Cl.
*H01L 21/302* (2006.01)
(52) U.S. Cl. .................. 438/9; 438/8; 438/459
(58) Field of Classification Search .......... 438/8, 438/9, 459
See application file for complete search history.

(56) References Cited

U.S. PATENT DOCUMENTS 7,235,492 B2 * 6/2007 Samoilov .................. 438/714

| 2002/0022368 | A1 * | 2/2002 | Lee ........................ 438/683 |
|---|---|---|---|
| 2002/0192930 | A1 | 12/2002 | Rhee et al. |
| 2003/0091739 | A1 * | 5/2003 | Sakamoto et al. ........ 427/248.1 |
| 2005/0037610 | A1 * | 2/2005 | Cha et al. ................. 438/637 |

FOREIGN PATENT DOCUMENTS

| JP | 63-062315 | 3/1988 |
|---|---|---|
| JP | 10-321533 | 12/1998 |
| KR | 2002-70820 | 9/2002 |
| KR | 1020040013300 | 2/2004 |

OTHER PUBLICATIONS

Korean Notice to Submit Response for Application No. 10/2004-0066530 mailed Mar. 24, 2006.
English Translation of Korean Notice to Submit Response for Application No. 10/2004-0066530 mailed Mar. 24, 2006.

* cited by examiner

*Primary Examiner*—Thao P. Le
(74) *Attorney, Agent, or Firm*—Myers Bigel Sibley & Sajovec

(57) ABSTRACT

Methods of etching a semiconductor substrate may include providing a first gas that is chemically reactive with respect to the semiconductor substrate, and while providing the first gas, providing a second gas different than the first gas. More particularly, a molecule of the second gas may include a hydrogen atom, and the second gas may lower a temperature at which the first gas chemically reacts with the semiconductor substrate. The mixture of the first and second gases may be provided adjacent the semiconductor substrate to etch the semiconductor substrate.

25 Claims, 9 Drawing Sheets

LOW TEMPERATURE METHODS OF ETCHING SEMICONDUCTOR SUBSTRATES

RELATED APPLICATION

This application claims the benefit of priority from Korean Patent Application No. 2004-66530 filed on Aug. 23, 2004, the disclosure of which is hereby incorporated herein by reference in its entirety.

FIELD OF THE INVENTION

The present invention relates to methods of manufacturing semiconductor devices, and more particularly, to methods of etching semiconductor substrates.

BACKGROUND

As information and telecommunication technologies improve, the semiconductor industry also makes improvements. To provide increased functionalities, a semiconductor device may be required to provide higher operating speeds and/or increased storage capacities. Semiconductor technologies have thus been developed to improve integration densities, reliability, and/or response speeds of semiconductor devices.

A conventional manufacturing process for a semiconductor device may include forming a wafer and processing the wafer. Single crystalline silicon of high purity may be formed on the wafer, and a plurality of processes may be performed on the wafer, thereby manufacturing semiconductor devices. Examples of semiconductor manufacturing processes include photo processes, etching processes, diffusion processes, deposition processes, etc.

A semiconductor substrate including silicon (Si), germanium (Ge), and/or silicon germanium (SiGe) may be etched away, or a thin layer on the substrate (such as a silicon (Si) layer, a germanium (Ge) layer, and/or a silicon germanium (SiGe) layer) may be etched away during the etching process.

In particular, an etching technology used to etch a substrate including silicon or a silicon layer (hereinafter referred to as an Si etching technology) has been widely used in processes for manufacturing semiconductor devices. For example, when a surface of a silicon substrate or a silicon layer is damaged or defective, the Si etching technology may be used to remove damaged or defective surface portions of the silicon substrate or the silicon layer. The Si etching technology may also be used to reduce a silicon (Si) thickness of a silicon-on-insulator (SOI) substrate. Furthermore, a local etching against a silicon (Si) area may be used to manufacture a semiconductor device.

An example of a local etching against a silicon (Si) area to manufacture a semiconductor device is disclosed in Korean Patent Laid-Open Publication No. 2004-13300, the disclosure of which is hereby incorporated herein in its entirety by reference. According to the above identified Korean patent publication, a portion of a silicon substrate corresponding to an active region may be etched away to a predetermined depth at a temperature in the range of about 600 degrees C. to about 800 degrees C. using a mixture of HCl (hydrogen chloride) gas and $H_2$ (hydrogen) gas as an etching gas, so that the active region is formed at a lower position than a field region with a stepped portion.

Another example of the local etching against a silicon (Si) area to manufacture a semiconductor device is disclosed in Japanese Patent Laid-Open Publication No. 1988-062315, the disclosure of which is hereby incorporated herein in its entirety by reference. According to the above referenced Japanese patent publication, an epitaxial layer may be formed using a first process and a second process performed in the same chamber as the first process. A silicon (Si) epitaxial layer may be grown to a predetermined thickness on a substrate in the first process, and the Si epitaxial layer may be selectively dry-etched using a mixture of HCl gas and $H_2$ gas as an etching gas in the second process. In addition, U.S. Patent Application Publication No. 2002-192930 discloses a method of forming a single crystalline silicon pattern, the disclosure of which is hereby incorporated herein in its entirety by reference. More particularly, a polycrystalline silicon layer on an insulation pattern is selectively etched at a temperature in the range of about 700 degrees C. to about 800 degrees C. using a mixture gas of HCl gas and $H_2$ gas as an etching gas. An example of the local etching against a silicon (Si) area to manufacture a semiconductor device is also disclosed in Japanese Patent Laid-Open Publication No. 1988-321533, the disclosure of which is hereby incorporated herein in its entirety by reference. More particularly, a distorted portion of a crystal, (caused by a curing used to remove crystal defects in a crystal growing process) may be removed by an Si etching technology using a mixture of $H_2$ gas and HCl gas remaining in a vapor growth furnace.

A chemical vapor etching (CVE) process using HCl gas may be performed in-situ with an epitaxial growth process, so that defective growth is reduced using the CVE process. Si etching during the CVE process, however, may require a high temperature. Since the HCl gas chemically dissolves at a temperature of about 800 degrees C., a high temperature of about 800 degrees C. may be required for the Si etching process. A high temperature of about 800 degrees C., however, may excessively accelerate electron diffusion in a semiconductor substrate, and device characteristics of a semiconductor device may thus deteriorate. A short channel effect in a transistor of an integrated circuit (IC) is an example of the resulting deterioration. In addition, a metal curing process used to cure damage in a metal layer may follow a metal deposition process. The metal curing process may be a low-temperature process and the Si etching process may thus be inapplicable to the metal curing process.

SUMMARY

According to some embodiments of the present invention, methods of etching a semiconductor substrate may include providing a first gas that is chemically reactive with respect to the semiconductor substrate, and while providing the first gas, providing a second gas different than the first gas. More particularly, a molecule of the second gas may include a hydrogen atom, and the second gas may lower a temperature at which the first gas chemically reacts with the semiconductor substrate. A mixture of the first and second gases may thus be provided adjacent the semiconductor substrate to etch the semiconductor substrate.

The second gas may accelerate a chemical decomposition of the first gas, and the mixture of the first and second gases may be provided adjacent the semiconductor substrate at a temperature in the range of about 500 degrees C. to about 700 degrees C. More particularly, the first gas may include at least one of HCl and/or HF, and the second gas may include at least one of $GeH_4$, $SiH_4$, $Si_2H_6$, $SiH_2Cl_2$, $SiHCl_3$, $PH_3$, $B_2H_6$, and/or $AsH_3$. For example, the first gas may include HCl, the second gas may include $GeH_4$, and a volume flow rate of HCl may be at least about 18.5 times greater than a volume flow rate of $GeH_4$. In an alternative, the first gas may include HCl, the second gas may include $SiH_4$, and a volume flow rate of HCl may be at least about 6 times greater than a volume flow rate of $SiH_4$.

The semiconductor substrate may include at least one of a silicon (Si) substrate, a germanium (Ge) substrate, a silicon-germanium (SiGe) substrate, a silicon-on-insulator (SOI) substrate, a silicon-germanium-on-insulator (SGOI) substrate, and/or a strained silicon (Si) substrate. After providing a mixture of the first and second gases adjacent the semiconductor substrate to etch the semiconductor substrate, an epitaxial semiconductor layer may be formed on the semiconductor substrate. Moreover, providing a mixture of the first and second gases adjacent the semiconductor substrate to etch the semiconductor substrate and forming the epitaxial semiconductor layer may be performed in-situ in a same processing chamber. In addition, a gate structure may be formed on the semiconductor substrate before providing the first and second gases. More particularly, providing the mixture of the first and second gases may include providing the mixture of the first and second gases adjacent the semiconductor substrate to etch portions of the semiconductor substrate on opposite sides of the gate structure.

According to additional embodiments of the present invention, methods of forming a semiconductor device may include forming a gate structure on a semiconductor substrate, and forming source and drain regions of the semiconductor substrate on opposite sides of the gate structure. After forming the source and drain regions, exposed portions of the source and drain regions on opposite sides of the gate structure may be etched using a mixture of first and second gases. More particularly, the first gas may be chemically reactive with respect to the semiconductor substrate. The second gas may be different than the first gas, and a molecule of the second gas may include a hydrogen atom. Moreover, the second gas may lower a temperature at which the first gas chemically reacts with the semiconductor substrate.

After etching exposed portions of the source and drain regions, an epitaxial layer of a semiconductor material may be formed on the etched portions of the source and drain regions. Forming the epitaxial semiconductor layer may include providing third and fourth gases wherein the third and fourth gases are different, and a molecule of the third gas may include an atom of the semiconductor material of the epitaxial layer. In addition, the fourth gas may be reactive with the semiconductor material to etch the semiconductor material. More particularly, the third gas may include at least one of $GeH_4$, $SiH_4$, $Si_2H_6$, $SiH_2Cl_2$, $SiHCl_3$, $PH_3$, $B_2H_6$, and/or $AsH_3$, and the fourth gas may include at least one of HCl and/or HF. For example, the third gas may include $GeH_4$, the fourth gas may include HCl, and a volume flow rate of HCl may be less than about 18.5 times greater than a volume flow rate of $GeH_4$. In an alternative, the third gas may include $SiH_4$, the fourth gas may include HCL, and a volume flow rate of HCl may be less than about 6 times greater than a volume flow rate of $SiH_4$. Moreover, etching exposed portions of the source and drain regions and forming an epitaxial semiconductor layer may be performed in-situ in a same processing chamber.

The second gas may accelerate a chemical decomposition of the first gas, and the semiconductor substrate may include at least one of a silicon (Si) substrate, a germanium (Ge) substrate, a silicon-germanium (SiGe) substrate, a silicon-on-insulator (SOI) substrate, a silicon-germanium-on-insulator (SGOI) substrate, and/or a strained silicon (Si) substrate. Moreover, etching exposed portions of the source and drain regions may include etching exposed portions of the source and drain regions at a temperature in the range of about 500 degrees C. to about 700 degrees C.

The first gas may include at least one of HCl and/or HF, and the second gas may include at least one of $GeH_4$, $SiH_4$, $Si_2H_6$, $SiH_2Cl_2$, $SiHCl_3$, $PH_3$, $B_2H_6$, and/or $AsH_3$. For example, the first gas may include HCl, the second gas may include $GeH_4$, and a volume flow rate of HCl may be at least about 18.5 times greater than a volume flow rate of $GeH_4$. In an alternative, the first gas may include HCl, the second gas may include $SiH_4$, and a volume flow rate of HCl may be at least about 6 times greater than a volume flow rate of $SiH_4$.

In addition, spacers may be formed on sidewalls of the gate structure before forming the source and drain regions. Moreover, forming source and drain regions may include implanting impurities into the semiconductor substrate on opposite sides of the gate structure.

According to yet additional embodiments of the present invention, methods of forming a semiconductor device may include etching a semiconductor substrate using a mixture of first and second gases. More particularly, the first gas may include at least one of HCl and/or HF, and the second gas may include at least one of $GeH_4$, $SiH_4$, $Si_2H_6$, $SiH_2Cl_2$, $SiHCl_3$, $PH_3$, $B_2H_6$, and/or $AsH_3$.

In addition, a gate structure may be formed on the semiconductor substrate and source and drain regions may be formed on opposite sides of the gate structure before etching the semiconductor substrate. Moreover, etching the semiconductor substrate may include etching exposed portions of the semiconductor substrate on opposite sides of the gate structure. Before forming the source and drain regions, spacers may be formed on sidewalls of the gate structure, and forming source and drain regions may include implanting impurities into the semiconductor substrate on opposite sides of the gate structure. An epitaxial layer of a semiconductor material may be formed on the semiconductor substrate after etching exposed portions of the source and drain regions.

In addition, forming the epitaxial semiconductor layer may include providing a third gas including at least one of $GeH_4$, $SiH_4$, $Si_2H_6$, $SiH_2Cl_2$, $SiHCl_3$, $PH_3$, $B_2H_6$, and/or $AsH_3$, and a fourth gas including at least one of HCl and/or HF. For example, the third gas may include $GeH_4$, the fourth gas may include HCl, and a volume flow rate of HCl may be less than about 18.5 times greater than a volume flow rate of $GeH_4$. In an alternative, the third gas may include $SiH_4$, the fourth gas may include HCL, and a volume flow rate of HCl may be less than about 6 times greater than a volume flow rate of $SiH_4$. Moreover, etching exposed portions of the source and drain regions and forming an epitaxial semiconductor layer may be performed in-situ in a same processing chamber.

The semiconductor substrate may include at least one of a silicon (Si) substrate, a germanium (Ge) substrate, a silicon-germanium (SiGe) substrate, a silicon-on-insulator (SOI) substrate, a silicon-germanium-on-insulator (SGOI) substrate, and/or a strained silicon (Si) substrate, and etching the semiconductor substrate may include etching the semiconductor substrate at a temperature in the range of about 500 degrees C. to about 700 degrees C.

For example, the first gas may include HCl, the second gas may include $GeH_4$, and a volume flow rate of HCl may be at least about 18.5 times greater than a volume flow rate of $GeH_4$. In an alternative, the first gas may include HCl, the second gas may include $SiH_4$, and a volume flow rate of HCl may be at least about 6 times greater than a volume flow rate of $SiH_4$. In addition, etching the semiconductor substrate may include etching the semiconductor substrate at a temperature less than about 750 degrees C., and more particularly, at a temperature less than about 700 degrees C.

According to embodiments of the present invention, methods of etching a semiconductor substrate may reduce characteristic deterioration of a semiconductor device.

According to embodiments of the present invention, methods of etching a semiconductor substrate at relatively low temperatures using a hydrogen source gas may be provided. First and second gases may be introduced onto a surface of the substrate, and the substrate may be etched away using the first and second gases. The first gas may chemically react with the substrate, and a second gas may lower a temperature of a chemical reaction between the first gas and the substrate. The second gas may include hydrogen atoms. The first gas may include HCl gas and/or HF gas. The second gas may include $GeH_4$, $Si_2H_6$, $SiH_2Cl_2$, $SiHCl_3$, $PH_3$, $B_2H_6$, and/or $AsH_3$.

The second gas may accelerate a chemical decomposition of the first gas, so that Si, Ge, and/or SiGe in the substrate may be etched at a relatively low temperature in the range of about 500 degrees C. to about 700 degrees C.

According to embodiments of the present invention, a method of manufacturing a semiconductor device may be provided. A gate structure may be formed on a semiconductor substrate, and a spacer may be formed on a sidewall of the gate structure. Source and drain regions may be formed at surface portions of the substrate by implanting impurities onto the substrate using the spacer as an implantation mask. Upper portions of the source and drain regions may be etched using a combination of first and second gases as an etching gas, thereby forming etched source and drain regions on the substrate. The first gas may chemically react with the upper portions of the source and drain regions and the second gas comprising a hydrogen atom may lower a temperature of a chemical reaction between the first gas and the substrate. A thin layer providing elevated source and drain regions may be formed on the etched source and drain regions, so that bulged source and drain regions are formed on the etched source and drain regions of the substrate.

Formation of the thin layer may be performed in-situ with etchings of the upper portions of the source and drain regions. In addition, the second gas may accelerate a chemical decomposition of the first gas during the etching step, and the upper portions of the source and drain regions may be etched at a temperature in the range of about 500 degrees C. to about 700 degrees C.

A third gas including a semiconductor material used to form an epitaxial layer and a fourth gas used to remove the epitaxial layer on the oxide layer may be provided on the surface of the substrate, thereby forming a thin layer that provides elevated source and drain regions on the etched source and drain regions of the substrate.

According to embodiments of the present invention, the first gas used to etch a semiconductor substrate may chemically decompose at a relatively low temperature in a range of about 500 degrees C. to about 700 degrees C. so that etching the substrate may be performed at a relatively low temperature, thereby reducing a deterioration of characteristics of a semiconductor device due to a high temperature.

DETAILED DESCRIPTION

Figure 1:
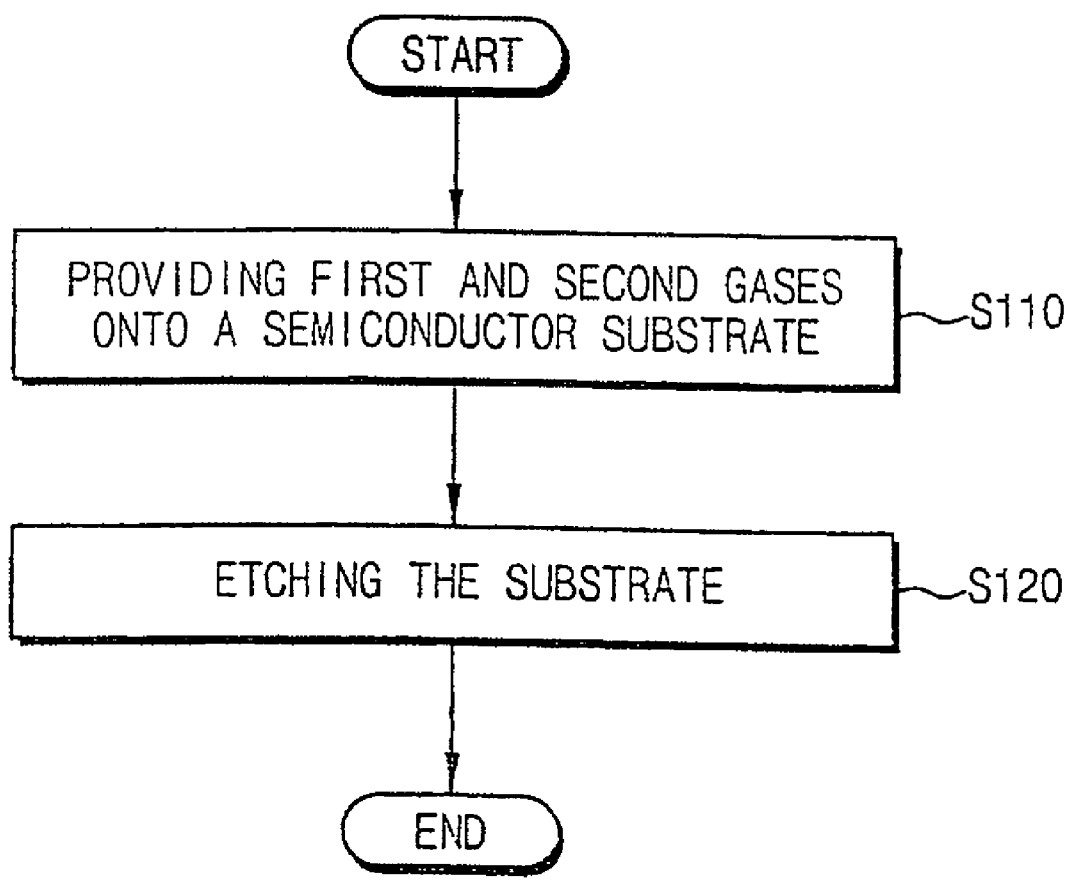
FIG. 1 is a flow chart illustrating steps of etching a substrate according to embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart illustrating steps of etching a substrate according to embodiments of the present invention. Referring to FIG. 1, a first gas is provided at first to etch the substrate. Examples of the first gas may include HCl gas, HF gas, and/or a mixture thereof. A mixture of hydrogen ($H_2$) gas and chloride ($Cl_2$) gas may be used instead of HCl gas, and a mixture of hydrogen ($H_2$) gas and fluorine ($F_2$) gas may be used instead of the HF gas.

Chlorine (Cl) and/or fluorine (F) in the first gas may chemically react with a semiconductor material such as silicon (Si), germanium (Ge), and/or silicon germanium (SiGe), so that the first gas may etch a semiconductor substrate such as a silicon (Si) substrate, a germanium (Ge) substrate, a silicon germanium (SiGe) substrate, a silicon-on-insulator (SOI) substrate, and/or a silicon germanium-on-insulator (SGOI) substrate. A strained silicon (Si) substrate with a strained epitaxial layer formed thereon may be also etched using the first gas. According to embodiments of the present embodiment, a silicon (Si) substrate may be used as the semiconductor substrate.

A second gas may also be provided to accelerate the chemical reaction between the first gas and the substrate. Examples of the second gas may include $GeH_4$, $SiH_4$, $Si_2H_6$, $SiH_2Cl_2$, $SiHCl_3$, $PH_3$, $B_2H_6$, $AsH_3$, etc. One or more of these gases can be used alone or in combination.

The second gas may be provided simultaneously with the first gas, or sequentially subsequent to the first gas. In particular embodiments, the second gas may be provided at the same time the first gas is provided (Step S110).

Most of the first gases may decompose at relatively high temperatures. For example, HCl gas may decompose at temperatures of about 800 degrees C. or higher. A reaction temperature of an etching process may be about 800 degrees C. or higher when HCl gas is solely used as the first gas. The relatively high reaction temperature of about 800 degrees C. may significantly deteriorate various device characteristics of a semiconductor device.

When a mixture of HCl gas and hydrogen ($H_2$) gas is used as the first gas, the $H_2$ gas may accelerate the decomposition of the HCl gas, so that the HCl gas decomposes at a temperature in the range of about 700 degrees C. to about 800 degrees C. Device characteristics of a semiconductor device, however may still deteriorate in the temperature range of about 700 degrees C. to about 800 degrees C.

The second gas may include the $H_2$ gas to accelerate the decomposition of the first gas. For example, the second gas may be provided to the substrate after being mixed with the $H_2$ gas. A bonding strength of the second gas may be relatively weaker than that of the first gas, so that the second gas may decompose at a temperature in the range of about 500 degrees C. to about 700 degrees C. The $H_2$ gas mixed with the second gas may also dissociate into hydrogen atoms during the decomposition of the second gas, and the dissociated hydrogen atoms may bond with hydrogen atoms from the HCl and/or HF, thereby generating hydrogen molecules ($H_2$) and chlorine ions (Cl—) and/or fluorine ions (F—). Accordingly, the chlorine ions (Cl—) and/or fluorine ions (F—) may be generated at a temperature in the range of about 500 degrees C. to about 700 degrees C. (which is significantly lower than 800 degrees C.). The chlorine ions (Cl—) or fluorine ions (F—) may react with silicon (Si) of the silicon (Si) substrate, thereby etching the silicon (Si) substrate. As a result, the silicon (Si) substrate may be etched at a relatively low temperature in a range of about 500 degrees C. to about 700 degrees C. (step S120).

Figure 2:
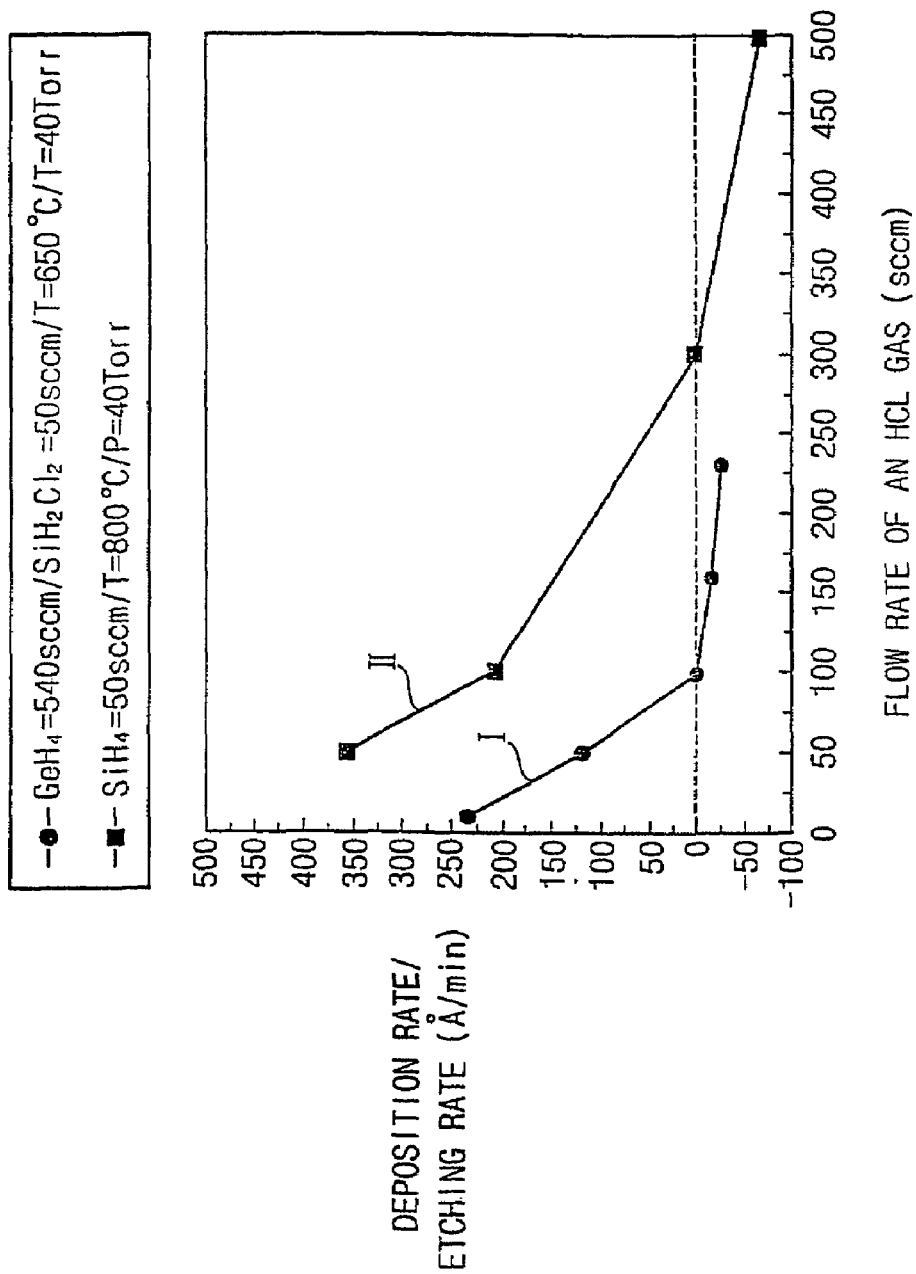
FIG. 2 is a graph illustrating growth rates and/or etching rates as a function of a flow rate of the HCl gas.

FIG. 2 is a graph illustrating deposition/etching rates as a function of a flow rate of HCl gas. In FIG. 2, the flow rate of the HCl gas is represented as a unit of standard cubic centimeters per minute (sccm), and the deposition/etching rate is represented as a unit of angstroms per minute (Å/min). A first graph I shows the deposition/etching rates in accordance with the indicated flow rates of the HCl gas from the x-axis with $GeH_4$ gas provided at a flow rate of about 540 sccm and with $SiH_2Cl_2$ gas provided at a flow rate of about 50 sccm at a temperature of about 650 degrees C. and a pressure of about 40 Torr. In the case of graph I, an amount of the $GeH_4$ gas may be relatively small as compared with an amount of $SiH_2Cl_2$ gas or the HCl gas. The $GeH_4$ gas may thus be provided as a mixture with $H_2$ gas at a volume concentration of about 1%. That is, a volume ratio of the $GeH_4$ gas with respect to the mixture gas may be about 1%, and a volume ratio of the $H_2$ gas with respect to the mixture gas may be about 99%. As a result, the $GeH_4$ gas may be uniformly provided to the substrate despite the relatively small amount.

A second graph II shows deposition/etching rates in accordance with the indicated flow rates of the HCl gas from the x-axis with $SiH_4$ gas provided at a flow rate of about 50 sccm at a temperature of about 800 degrees C. and a pressure of about 40 Torr.

Graph I of FIG. 2 indicates that an etching against a polycrystalline silicon or a deposition of silicon (Si) or germanium (Ge) may be determined in accordance with the flow rate of the HCl gas. More particularly, when the flow rate of the HCl gas is less than about 100 sccm, deposition using $GeH_4$ gas and/or $SiH_2Cl_2$ gas exceeds etching using the HCl gas, thereby depositing a silicon (Si) layer or a germanium (Ge) layer on the substrate. In contrast, when the flow rate of the HCl gas is greater than about 100 sccm, etching using the HCl gas deposition may exceed deposition using GeH$_4$ gas and/or SiH$_2$Cl$_2$ gas, thereby etching the silicon (Si) substrate.

A reaction temperature of the GeH$_4$ gas may be lower than that of the SiH$_2$Cl$_2$ gas. A chemical reaction with the GeH$_4$ gas (and not with the SiH$_2$Cl$_2$ gas) may thus primarily determine which of the etching process or the deposition process is performed. That is, a ratio of the flow rate between the GeH$_4$ gas and the HCl gas may primarily determine which of two processes is performed. In embodiments of Graph I, the volume concentration of the GeH$_4$ gas was about 1%, and thus an actual flow rate of the GeH$_4$ gas was about 5.4 sccm. Accordingly, the ratio of the flow rate of the GeH$_4$ and HCl gases was about 18.5 (equal to about 100 sccm divided by about 5.4 sccm) so that the etching and deposition processes were separated from each other on a basis of the flow rate ratio of about 18.5 in the embodiments of Graph I. When an amount of the HCl gas is about 18.5 times (or more) greater than that of the GeH$_4$ gas, the etching process against the substrate may be initiated, and then the higher the flow rate of the HCl gas, the higher the etching rate of the substrate.

Referring to graph II shown in FIG. 2, the flow rate of the HCl gas may primarily determine which of the etching process or the deposition process is performed. When the flow rate of the HCl is less than about 300 sccm, deposition using the SiH$_4$ gas may exceed etching using the HCl gas, so that silicon is deposited on the substrate. When the flow rate of the HCl is greater than about 300 sccm, etching using HCl gas may exceed deposition using SiH$_4$ gas, so that the substrate is etched. That is, a ratio of the flow rate between the GeH$_4$ gas and the HCl gas may determine whether etching or deposition is performed.

The SiH$_4$ gas may be provided at a flow rate of about 50 sccm when the flow rate of the HCl gas is about 300 sccm, so that the ratio of the flow rate of the SiH$_4$ and HCl gases may be about 6 (equal to 300 sccm divided by 50 sccm). As a result, the etching and deposition processes may be separated from each other on a basis of the flow rate ratio of about 6 in the present embodiment. When an amount of the HCl gas is about 6 times (or more) larger than that of the SiH$_4$ gas, the etching process against the substrate may be initiated, and then the higher the flow rate of the HCl gas, the higher the etching rate of the substrate.

Figure 3:
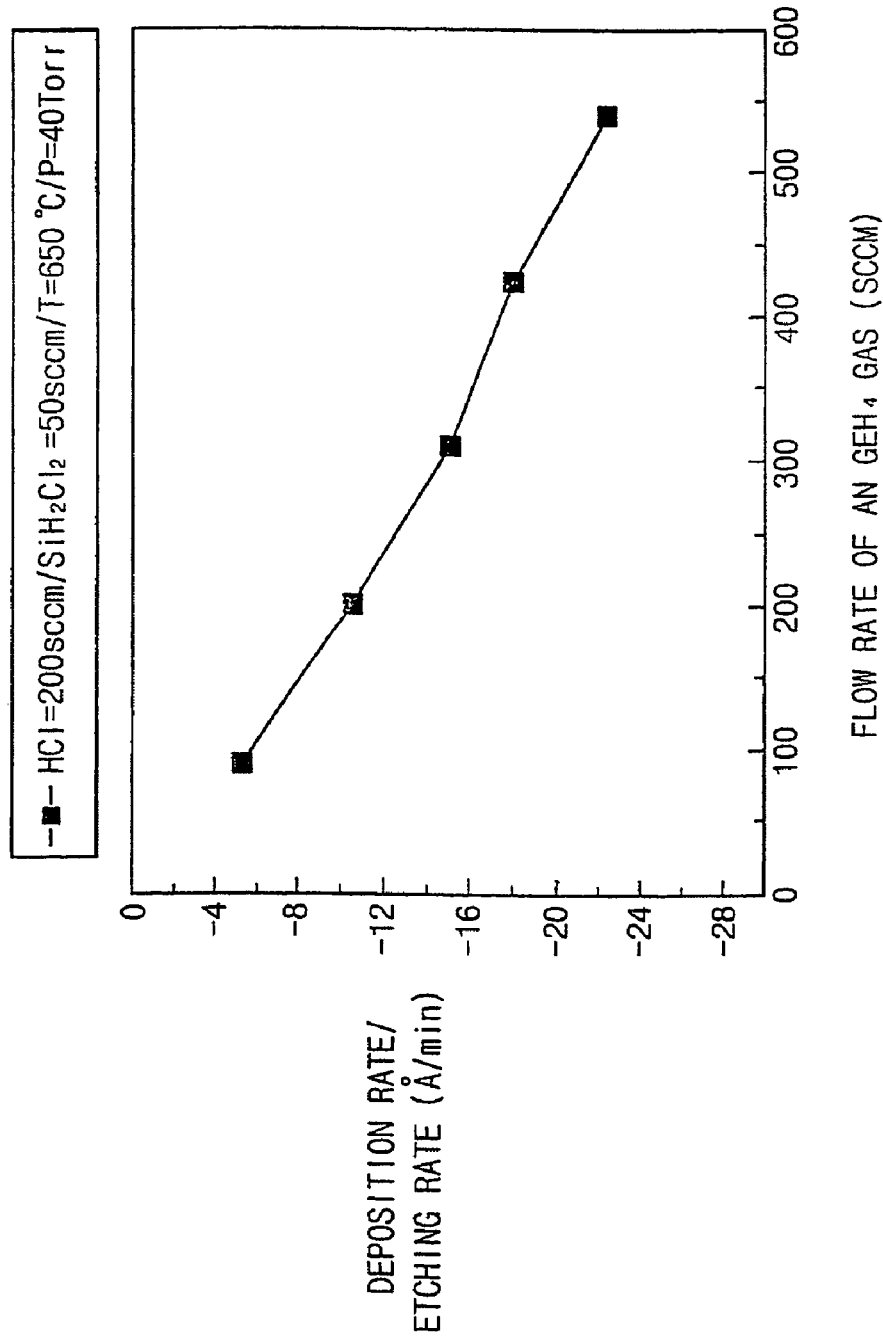
FIG. 3 is a graph illustrating growth rates and/or etching rates as a function of a flow rate of the $GeH_4$ gas.

FIG. 3 is a graph illustrating deposition/etching rates as a function of a flow rate of the GeH$_4$ gas. In FIG. 3, the flow rate of the GeH$_4$ gas is represented as a unit of standard cubic centimeters per minute (sccm), and the deposition/etching rate is represented as a unit of angstroms per minute (Å/min). The graph shown in FIG. 3 indicates deposition/etching rates in accordance with the flow rate of GeH$_4$ gas with HCl gas provided at a flow rate of about 200 sccm and with SiH$_2$Cl$_2$ gas provided at a flow rate of about 50 sccm at a temperature of about 650 degrees C. and at a pressure of about 40 Torr.

Referring to FIG. 3, the higher the flow rate of the GeH$_4$ gas, the higher the etching rate of the substrate, so that the etching rate of the substrate may be proportional to the flow rate of the GeH$_4$ gas if the flow rate of the HCl gas is constant. The graphs shown in FIGS. 2 and 3 indicate that the etching rate of the substrate may be proportional to the flow rate of the GeH$_4$ gas if the HCl gas is provided at a minimal amount sufficient to initiate the etching process against the substrate.

Figure 4:
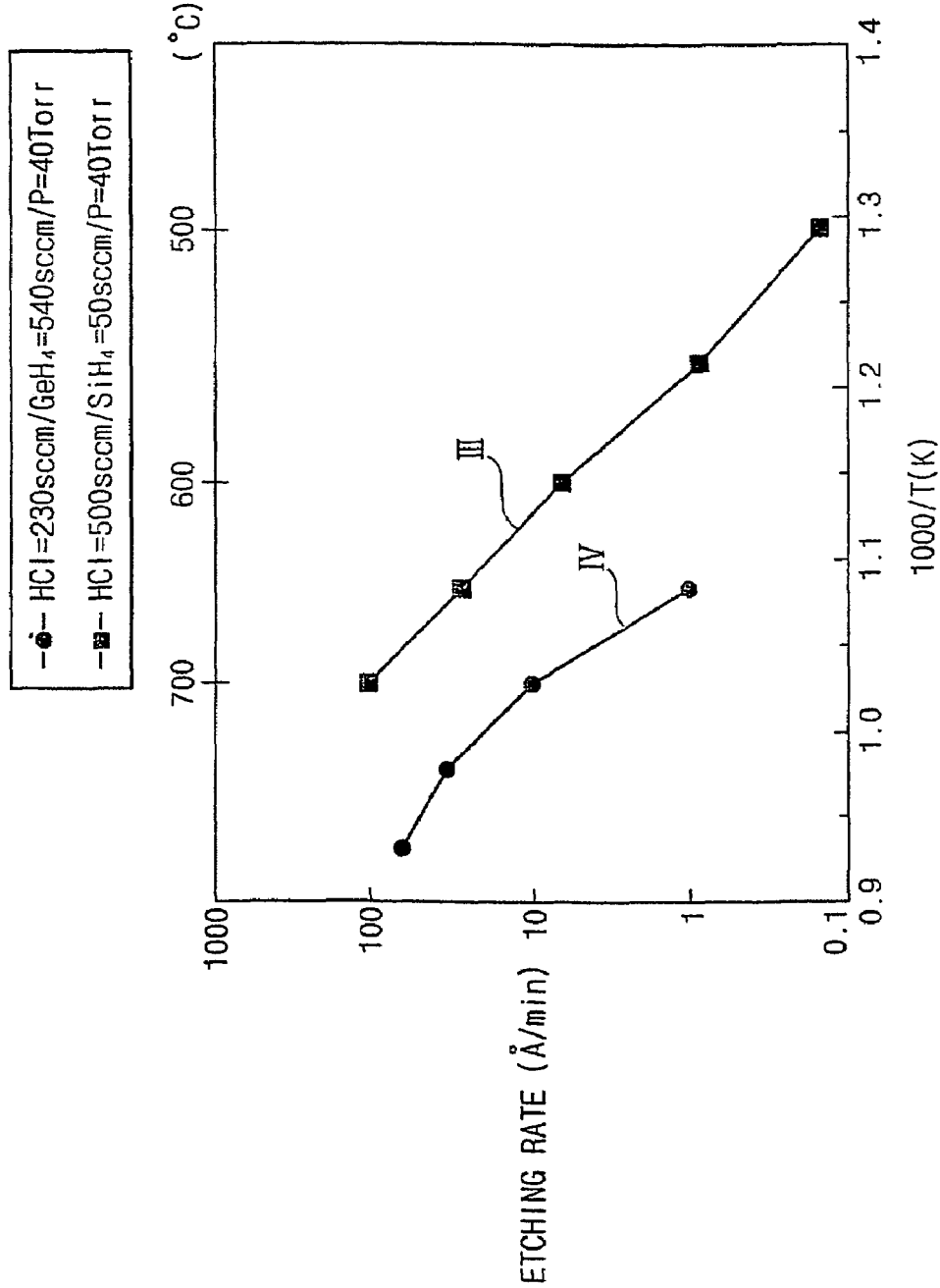
FIG. 4 is a graph illustrating etching rates of the substrate as a function of a temperature of a chemical reaction for the etching process.

FIG. 4 is a graph illustrating etching rates of a substrate as a function of a temperature of a chemical reaction for the etching process. In FIG. 4, the temperature is represented on a Celsius scale (° C.) and is modified as a ratio of one thousand with respect to the temperature of a Kelvin scale (K), and the etching rate is represented as a unit of angstroms per minute (Å/min). A graph III of FIG. 4 indicates etching rates in accordance with the indicated reaction temperatures with an HCl gas provided at a flow rate of about 230 sccm and a GeH$_4$ gas provided at a flow rate of about 540 sccm at a pressure of about 40 Torr and a temperature in the range of about 500 degrees C. to about 700 degrees C. A graph IV of FIG. 4 indicates etching rates in accordance with the indicated reaction temperatures with HCl gas provided at a flow rate of about 500 sccm and with SiH$_4$ gas provided at a flow rate of about 50 sccm at a pressure of about 40 Torr.

As indicated in graph III, an etching rate of the substrate may be proportional to the reaction temperature of the GeH$_4$ gas, and may cross in a temperature range from about 500 degrees C. to about 700 degrees C. Accordingly, when the GeH$_4$ gas is used as the second gas, the substrate may be etched at a relatively low temperature in a range of about 500 degrees C. to about 700 degrees C., so that the deterioration of device characteristics of a semiconductor device may be reduced.

Further, graph IV of FIG. 4 indicates that even though the SiH$_4$ gas is used in place of the GeH$_4$ gas, etching rather than deposition may be performed, and an etching rate of the substrate may also be proportional to the reaction temperature of the SiH$_4$ gas. Graph IV of FIG. 4 also indicates that the etching rates may overlap with respect to a temperature in the range of about 650 degrees C. to about 800 degrees C. Accordingly, when SiH$_4$ gas is used as the second gas, the substrate may be etched at a relatively high temperature in a range of about 650 degrees C. to about 800 degrees C. as compared with when GeH$_4$ gas is used. As a result, when the SiH$_4$ gas is used as the second gas, processing conditions may be controlled such that the substrate is etched at a temperature in a range of about 650 degrees C. to about 700 degrees C. at a somewhat reduced etching rate, so that deterioration of device characteristics of a semiconductor device may be reduced.

Graphs III and IV indicate that the etching rate of the substrate may be greater when the GeH$_4$ gas and the HCl gas are used than when the SiH$_4$ gas and the HCl gas are used. For example, the etching rate of the substrate may be about 100 Å/min (Angstroms/minute) at a temperature of about 700 degrees C. when GeH$_4$ gas and HCl gas are provided. In contrast, when the SiH$_4$ gas and the HCl gas are provided, the etching rate may be about 10 Å/min (Angstroms/minute) at the same temperature of about 700 degrees C. These results may occur because a reaction heat of the GeH$_4$ gas may be lower than that of the SiH$_4$ gas. The GeH$_4$ gas may thus decompose at a temperature lower than the SiH$_4$ gas.

While an etching rate of polycrystalline silicon in an Si substrate has been described above, an etching rate of mono-crystalline silicon may usually be lower than that of polycrystalline silicon because an etching process using chlorine ions and/or fluorine ions against the mono-crystalline silicon may be significantly influenced by a bonding energy of a lattice.

Figure 5:
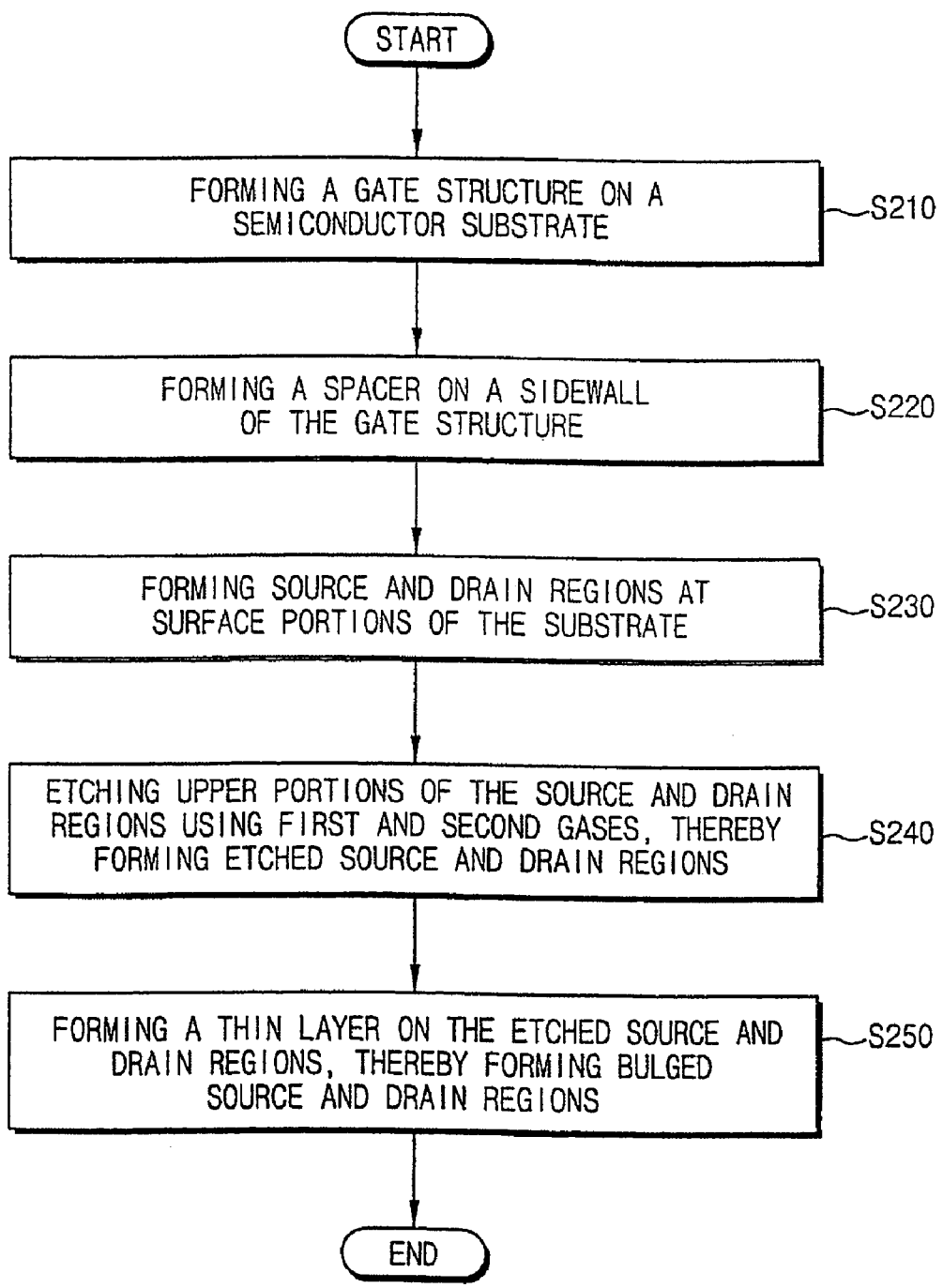
FIG. 5 is a flow chart illustrating steps of manufacturing a semiconductor device according to embodiments of the present invention.

FIG. 5 is a flow chart illustrating a method of manufacturing a semiconductor device according to embodiments of the present invention. FIGS. 6 to 9 are cross sectional views illustrating processing steps for a method of manufacturing the semiconductor device according to FIG. 5.

Figure 6:
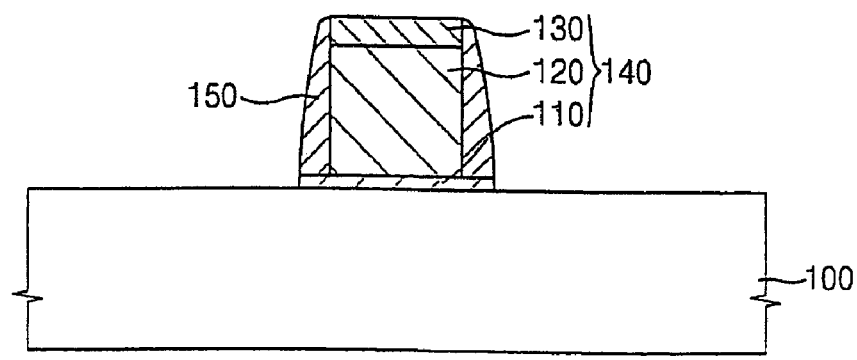
FIGS. 6 to 9 are cross sectional views illustrating steps of manufacturing semiconductor devices according to embodiments of the present invention.

Referring to FIGS. 5 and 6, an isolation layer(s) (not shown) is formed on a semiconductor substrate 100 using a device isolation process such as a shallow trench isolation (STI) process and/or a local oxidation of silicon (LOCOS) process. Accordingly, the substrate 100 may be separated into an active region(s) on which a conductive structure(s) may be formed and a field region(s) defining the active region(s). The isolation layer(s) may be formed in the field region(s) to electrically isolate conductive structures in the active region(s). The isolation layer(s) in the field region(s) may thus be referred to as a device isolation layer(s).

The semiconductor substrate 100 may be a silicon (Si) substrate, a germanium (Ge) substrate, a silicon germanium (SiGe) substrate, a silicon-on-insulator (SOI) substrate, silicon germanium-on-insulator (SGOI) substrate, and/or a strained silicon (Si) substrate on which a strained epitaxial layer is formed. According to embodiments of the present invention discussed below the semiconductor substrate 100 may be a silicon (Si) substrate.

A gate oxide layer (not shown) may be formed in the active region of the substrate 100 using a thermal oxidation and/or a chemical vapor deposition (CVD). A conductive layer (not shown) and a mask layer (not shown) may be sequentially formed on the gate oxide layer. More particularly, the conductive layer (not shown) may include doped polysilicon and/or polycide including doped polysilicon and a metal silicide). A photoresist pattern (not shown) may be formed on the mask layer using a photolithography process, and then the mask layer, the conductive layer and the gate oxide layer may be sequentially etched using the photoresist pattern as an etching mask. A gate structure 140 may thus be formed including a gate oxide pattern 110, a gate conductive pattern 120, and a gate mask pattern 130 sequentially stacked on the substrate 100 (step S210).

In an alternative, the mask layer may be patterned using the photoresist pattern as an etching mask, thereby forming the mask pattern 130. Then, the photoresist pattern may be removed, and the conductive layer and the gate oxide layer may be sequentially etched away using the mask pattern 130 as an etching mask, thereby forming the gate structure 140 including the gate oxide pattern 110, the gate conductive pattern 120, and the gate mask pattern 130 sequentially stacked on the substrate 100.

An insulation layer (not shown) including a nitride (such as silicon nitride) may be formed on the substrate 100 and the gate structure 140. The insulation layer may then be anisotropically etched from the substrate 100, thereby forming gate spacer(s) 150 on sidewall(s) of the gate structure 140 (step S220).

Figure 7:
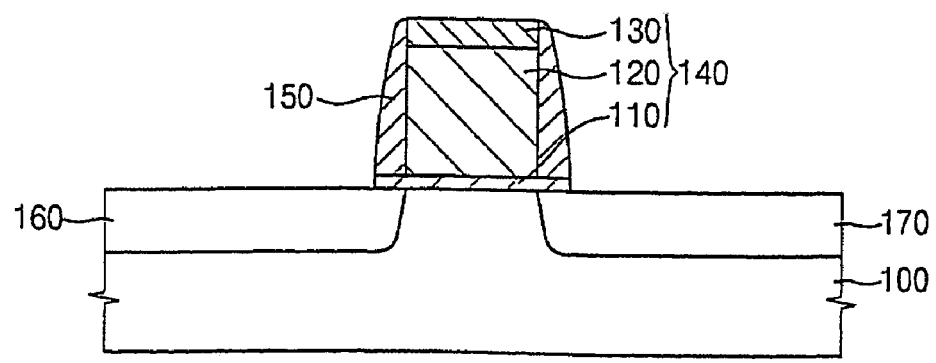

Referring to FIGS. 5 and 7, impurities (also referred to as dopants) may be implanted onto a surface of the substrate 100 using the gate structure 140 and the gate spacer 150 as an implant mask. A heat treatment may then be performed on the substrate 100, thereby forming source and drain regions 160 and 170 at surface portions of the substrate 100 (step S230).

Figure 8:
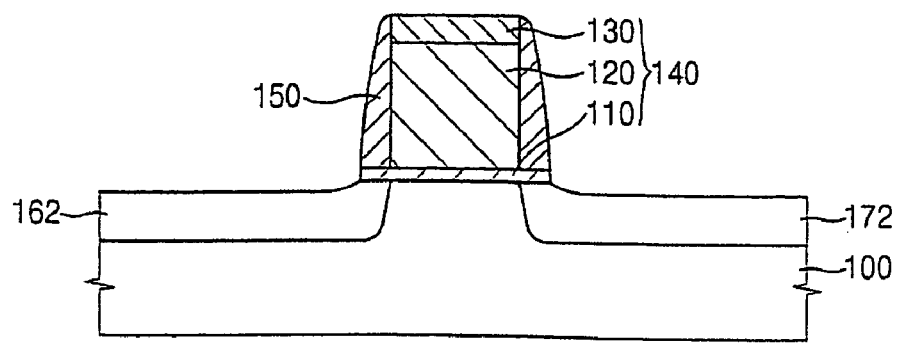

Referring to FIGS. 5 and 8, a first gas used to etch the substrate 100 (including the source and drain regions 160 and 170) and a second gas used to accelerate a chemical reaction between the first gas and the substrate 100 are introduced. Exposed portions of the source and drain regions 160 and 170 may thus be etched.

The first gas may include HCl gas, HF gas, and/or a mixture thereof. A mixture of a hydrogen ($H_2$) gas and a chloride ($Cl_2$) gas may be used as an HCl gas, and a mixture of a hydrogen ($H_2$) gas and a fluorine ($F_2$) gas may be used as an HF gas. The second gas may include $GeH_4$, $SiH_4$, $Si_2H_6$, $SiH_2Cl_2$, $SiHCl_3$, $PH_3$, $B_2H_6$, $AsH_3$, etc. These examples of the second gas can be used alone or in combinations thereof. The second gas may be initially provided simultaneously with initially providing the first gas, or initially provided sequentially subsequent to initially providing the first gas. More particularly, the second gas may be provided together with the first gas whether the first and second gases are initially provided together or sequentially.

Etching upper portions of the source and drain regions 160 and 170 may be performed using a process substantially identical to an etching process used on the substrate 100. In embodiments of the present embodiment, an HCl gas may be used as the first gas, and a $GeH_4$ gas may be used as the second gas.

The HCl gas may decompose at a temperature of about 800 degrees C., and thus a reaction temperature of an etching process used to etch upper portions of the source and drain regions 160 and 170 may be about 800 degrees C. when HCl gas is the only etching agent. A relatively high reaction temperature of about 800 degrees C. may significantly deteriorate various device characteristics of a semiconductor device.

A $GeH_4$ gas may be provided to the substrate 100 after being mixed with $H_2$ gas. A bonding strength of a $GeH_4$ gas may be relatively weaker than that of an HCl gas, so that the $GeH_4$ gas decompose at a temperature in the range of about 500 degrees C. to about 700 degrees C. The $H_2$ gas mixed with the $GeH_4$ gas may also dissociate into hydrogen atoms during decomposition of the $GeH_4$ gas, and the dissociated hydrogen atoms may bond with hydrogen atoms in the HCl to generate hydrogen molecules ($H_2$) and chlorine ions (Cl—). Accordingly, the chlorine ions (Cl—) may be generated at a temperature in the range of about 500 degrees C. to about 700 degrees C. (which is significantly lower than 800 degrees C.). The chlorine ions (Cl—) may react with silicon (Si) at upper portions of the source and drain regions 160 and 170 to etch upper portions of the source and drain regions 160 and 170. As a result, upper portions of the source and drain regions 160 and 170 may be etched off at a relatively low temperature in a range of about 500 degrees C. to about 700 degrees C. Reference numbers 162 and 172 in FIG. 8 denote the etched source and drain regions of the substrate 100.

According to embodiments of the present embodiment, a volume of the HCl gas may be about 18.5 times (or more) greater than that of the $GeH_4$ gas used to initiate etching of upper portions of the source and drain regions 160 and 170. In an alternative, if an $SiH_4$ gas is introduced instead of the $GeH_4$ gas, a volume of the HCl gas may be about 6 times (or more) greater than that of the $SiH_4$ gas used to initiate the etching. As a result, the source and drain regions 160 and 170 may be etched to a predetermined depth from a surface of the substrate 100 adjacent to the gate structure 140 (step S240). Implantation damage on a surface of the substrate may obstruct a silicon growth from the surface. Accordingly, silicon growth on the source and drain regions may be performed after a damaged surface portion of the substrate is removed by etching.

Figure 10:
FIG. 10 is a scanning electron microscope (SEM) picture illustrating shallow-etched source and drain regions shown in FIG. 8.
Figure 11:
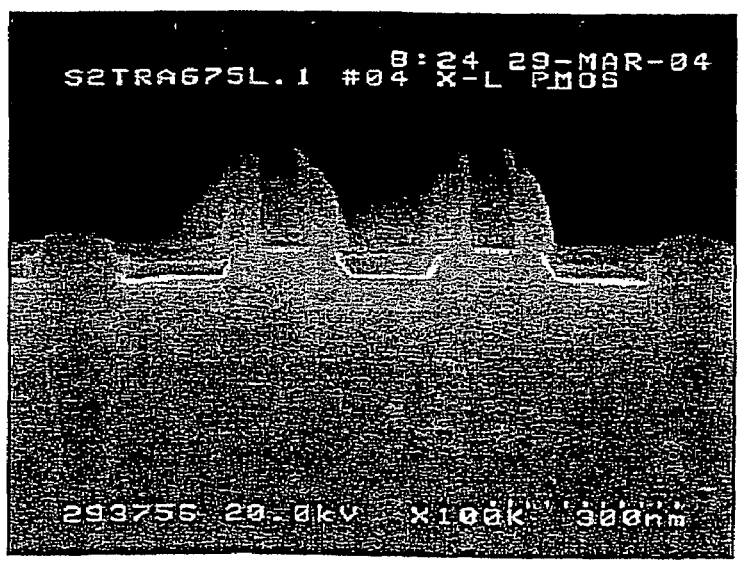
FIG. 11 is a SEM picture illustrating deep-etched source and drain regions shown in FIG. 8.

FIG. 10 is a picture illustrating shallow-etched source and drain regions formed as discussed above with respect to FIGS. 6-8, and FIG. 11 is a picture illustrating deep-etched source and drain regions formed as discussed above with respect to FIGS. 6-8. FIGS. 10 and 11 are pictures taken by a scanning electron microscope (SEM). The SEM picture in FIG. 10 illustrates source and drain regions of which processing defects and/or processing damage are removed and/or cured and/or reduced using an etching process according to embodiments of the present invention, and the SEM picture in FIG. 11 illustrates source and drain regions of which structures are formed into a hetero type by an etching process according to embodiments of the present invention.

Referring to FIG. 10, the etched source and drain regions 162 and 172 of the substrate 100 may have an etching depth of about 100 Å. In embodiments of the present embodiment, etching the source and drain regions 160 and 170 may be performed using HCl gas as the first gas and using $GeH_4$ gas as the second gas at a temperature of about 650 degrees C. and a pressure of about 40 Torr to provide an etching depth at about 100 Å (Angstroms).

Referring to FIG. 11, the etched source and drain regions 162 and 172 of the substrate 100 may have an etching depth of about 500 Å (Angstroms). In embodiments of the present invention, etching the source and drain regions 160 and 170 may be performed using HCl gas as the first gas and using (GeH$_4$ gas as the second gas at a temperature of about 650 degrees C. and a pressure of about 40 Torr to provide an etching depth of about 500 Å (Angstroms).

Figure 9:
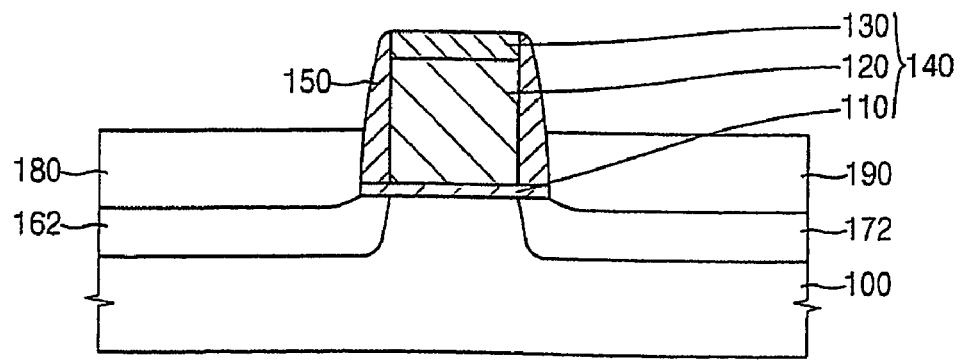

Referring to FIGS. 5 and 9, a semiconductor material may be grown on the etched source and drain regions 162 and 172 using selective epitaxial growth (SEG). Examples of the semiconductor material grown using SEG may include silicon, germanium, silicon germanium, etc. These semiconductor materials can be used alone or in combinations thereof.

When oxide layers and/or nitride layers are locally formed on a surface of the substrate, an epitaxial thin layer may be formed on the surface of the substrate between the oxide layers and/or the nitride layers using SEG. SEG may be performed using various processes such as atmospheric pressure chemical vapor deposition (APCVD), low-pressure chemical vapor deposition (LPCVD), molecular beam epitaxi (MBE), and/or ultra-high vacuum chemical vapor deposition (UHVCVD) at various temperature and/or pressure conditions.

A third gas and a fourth gas may be provided on a surface of the substrate including the etched source and drain regions 162 and 172 to form bulged (i.e., raised) source and drain regions 180 and 190. The third gas may include semiconductor materials used to form the epitaxial layer, and the fourth gas may remove a portion of the epitaxial layer on an oxide layer. Examples of the third gas may include GeH$_4$ gas, SiH$_4$ gas, Si$_2$H$_6$ gas, Si$_2$H$_2$Cl$_2$ gas, SiHCl$_3$ gas, etc. One or more of these gases can be used alone or in combinations thereof. Examples of the fourth gas may include HCl gas, HF gas, and/or a mixture thereof. A mixture of hydrogen (H$_2$) gas and chloride (Cl$_2$) gas may be used instead of HCl gas, and a mixture of hydrogen (H$_2$) gas and fluorine (F$_2$) gas may be used instead of the HF gas. The fourth gas may be initially provided simultaneously with initially providing the third gas, or sequentially subsequent to initially providing the third gas. In embodiments of the present invention, the fourth gas may be provided at a same time when the third gas is provided whether the two gases are initially provided together or not.

When silicon is grown on a surface of the substrate 100, the third gas may be any one or more selected from SiH$_4$ gas, Si$_2$H$_6$ gas, Si$_2$H$_2$Cl$_2$ gas, SiHCl$_3$ gas, and/or combinations thereof. When germanium is grown on the surface of the substrate 100, GeH$_4$ gas may be used as the third gas.

As indicated in the first graph I in FIG. 2, which shows deposition/etch rates according to the flow rate of the HCl gas when GeH$_4$ gas is provided at a flow rate of about 540 sccm and SiH$_2$Cl$_2$ gas is provided at a flow rate of about 50 sccm at a temperature of about 650 degrees C. and a pressure of about 40 Torr, etching a polycrystalline silicon of the substrate 100 or silicon (Si) or germanium (Ge) on the substrate 100 may be determined by a flow rate of HCl gas.

More particularly, when the flow rate of the HCl gas is less than about 100 sccm, deposition using GeH$_4$ gas or SiH$_2$Cl$_2$ gas may exceed etching using the HCl gas too form a silicon (Si) layer or a germanium (Ge) layer on the substrate. In the experiment for graph I, an amount of GeH$_4$ gas was relatively very small compared with an amount of SiH$_2$Cl$_2$ gas or HCl gas. Accordingly, the GeH$_4$ gas may be provided as a mixture gas with H$_2$ gas at a volume concentration of about 1%. That is, a volume ratio of the GeH$_4$ gas with respect to the mixture may be about 1%, and a volume ratio of the H$_2$ gas with respect to the mixture gas may be about 99%. As a result, GeH$_4$ gas may be uniformly provided to the substrate despite the relatively small amount.

A reaction temperature of GeH$_4$ gas may be lower than that of SiHCl$_2$ gas. Accordingly, a chemical reaction with GeH$_4$ gas (not with the SiH$_2$Cl$_2$ gas) may determine which of two processes, etching or deposition, is performed. That is, a ratio of the flow rate between GeH$_4$ gas and HCl gas may primarily determine whether deposition or etching is performed. In embodiments of the present invention, the volume concentration of GeH$_4$ gas may be about 1% and an actual flow rate of the GeH$_4$ gas may be about 5.4 sccm. Accordingly, the ratio of the flow rate of GeH$_4$ and HCl gases may be about 18.5 (equal to about 100 sccm divided by about 5.4 sccm), so that etching and deposition processes may be separated from each other on a basis of the flow rate ratio of about 18.5 according to embodiments of the present invention. When an amount of the HCl gas is less than about 18.5 times greater than that of GeH$_4$ gas, germanium may be deposited on the etched source and drain regions 162 and 172.

As indicated in the second graph II in FIG. 2, which shows the deposition/etching rates in accordance with the flow rate of HCl gas when SiH$_4$ gas is provided at a flow rate of about 50 sccm at a temperature of about 800 degrees C. and a pressure of about 40 Torr, the flow rate of HCl gas primarily determines whether etching as deposition is performed.

When the flow rate of HCl is less than about 300 sccm, deposition using SiH$_4$ gas exceeds etching using HCl gas, so that silicon is deposited on the etched source and drain regions 162 and 172 of the substrate 100.

The SiH$_4$ gas may be provided at a flow rate of about 50 sccm when the flow rate of the HCl gas is about 300 sccm, so that the ratio of the flow rate of the SiH$_4$ and HCl gases is about 6 (equal to 300 sccm divided by 50 sccm). As a result, the etching and deposition processes may be separated from each other on a basis of the flow rate ratio of about 6. When an amount of HCl gas is less than about 6 times greater than that of SiH$_4$ gas, silicon may be deposited on the etched source and drain regions 162 and 172 of the substrate 100. The lower the flow rate of HCl gas, the higher the deposition rate of silicon.

As a result, silicon or germanium may be deposited on the etched source and drain regions 162 and 172, thereby forming the bulged (i.e., raised) source and drain regions 180 and 190 (step S250).

Figure 12:
FIG. 12 is a SEM picture illustrating the bulged source and drain regions shown in FIG. 9.

FIG. 12 is a SEM picture illustrating the bulged (i.e., raised) source and drain regions formed as discussed above with respect to FIGS. 6-9. The SEM picture in FIG. 11 illustrates a hetero type bulged (i.e., raised) source and drain regions 180 and 190. That is, an epitaxial layer is grown on the etched source and drain regions 162 and 172 having an etch depth of about 500 Å (Angstroms), and the epitaxial layer may include a material different from that of the substrate 100. The SEM picture in FIG. 12 shows a silicon germanium (SiGe) layer selectively grown on the etched source and drain region 162 and 172 using a SEG process with a mixture of GeH$_4$ gas and SiH$_2$Cl$_2$ gas as the third gas, and using the HCl gas as the fourth gas at a temperature of about 650 degrees C. and a pressure of about 40 Torr. In an alternative, silicon may be grown by etching the source and drain regions 160 and 170 of a strained silicon or a silicon germanium substrate.

The source and drain regions 162 and 172 of the substrate 100 may be etched in-situ with the bulged (i.e., raised) source and drain regions 180 and 190. More particularly, etching upper portions of the source and drain regions 160 and 170 may be performed in-situ with an Si or Ge deposition on the etched source and drain regions 162 and 172 in a same process chamber. The Si or Ge deposition may be performed in an epitaxial deposition apparatus so that an etching of silicon (Si) or germanium (Ge) of the upper portions of the source and drain regions 160 and 170 may be performed in-situ with an epitaxial growth on the etched source and drain regions 162 and 172 of the substrate 100, thereby forming the bulged (i.e., raised) source and drain regions 180 and 190 with a reduction of defects.

The third and fourth gases used to deposit silicon or germanium on the etched source and drain regions 162 and 172 may be substantially the same as the first and second gases used to etch upper portions of the source and drain 160 and 170. That is, the fourth gas may be substantially the same as the first gas, and the third gas may be substantially the same as the second gas. In this case, the flow rate ratio of the first gas with respect to the second gas or of the fourth gas with respect to the third gas may determine whether etching for the etched source and drain regions 162 and 172 or deposition for the bulged (i.e. raised) source and drain regions 180 and 190, is performed.

Thereafter, various unit processes for manufacturing a semiconductor device are performed on the substrate 100 including the bulged source and drain regions 180 and 190, thereby completing the semiconductor device. That is, an insulation interlayer (not shown) is formed to a sufficient thickness to cover the gate structure 140, and is planarized until a top surface of the gate structure 140 is exposed. Then, various contacts are formed on the gate structure 140 for transmitting electric signals to the gate structure 140.

According to embodiments of the present invention, various hydrogen source gases, such as $GeH_4$ gas, $SiH_4$ gas, and/or $SiH_2Cl_2$ gas may be mixed with an etching gases, such as HCl gas and/or HF gas. Hydrogen atoms dissociated from the hydrogen source gas may accelerate decomposition of the etching gas. In particular, $GeH_4$ gas may be dissociated at a relatively low temperature and HCl may decompose at a relatively low temperature in a range of about 500 degrees C. to about 700 degrees C. As a result, silicon in the substrate may be etched by chloride ions (Cl—) at a relatively low temperature in a range of about 500 degrees C. to about 700 degrees C., thereby reducing deterioration of device characteristics of a semiconductor device due to high temperatures. Accordingly, silicon (Si) etching technology according to embodiments of the present invention may also be applied to a metal process that is particularly sensitive to temperature.

An amount of HCl gas may primarily determine whether etching the substrate or deposition on the substrate is performed, and an etching rate or a deposition rate may be controlled by adjusting a flow rate of HCl gas and $GeH_4$ gas. The etching and deposition processes may be performed in-situ in a same epitaxial deposition apparatus.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A method of etching a semiconductor substrate, the method comprising:
providing a first gas that is chemically reactive with respect to the semiconductor substrate;
while providing the first gas, providing a second gas different than the first gas wherein a molecule of the second gas includes a hydrogen atom and wherein the second gas lowers a temperature at which the first gas chemically reacts with the semiconductor substrate; and
providing a mixture of the first and second gases adjacent the semiconductor substrate to etch the semiconductor substrate.

2. A method according to claim 1 wherein the second gas accelerates a chemical decomposition of the first gas.

3. A method according to claim 1 wherein the mixture of the first at second gases is provided adjacent the semiconductor substrate at a temperature in the range of about 500 degrees C. to about 700 degrees C.

4. A method according to claim 1 wherein the first gas comprises at least one of HCl and/or HF, and wherein the second gas comprises at least one of $GeH_4$, $SiH_4$, $Si_2H_6$, $SiH_2Cl_2$, $SiHCl_3$, $PH_3$, $B_2H_6$, and/or $AsH_3$.

5. A method according to claim 1 wherein the first gas comprises HCl and the second gas comprises $GeH_4$, and wherein a volume flow rate of HCl is at least about 18.5 times greater than a volume flow rate of $GeH_4$.

6. A method according to claim 1 wherein the first gas comprises HCl and the second gas comprises $SiH_4$, and wherein a volume flow rate of HCl is at least about 6 times greater than a volume flow rate of $SiH_4$.

7. A method according to claim 1 wherein the semiconductor substrate comprises at least one of a silicon (Si) substrate, a germanium (Ge) substrate, a silicon-germanium (SiGe) substrate, a silicon-on-insulator (SOI) substrate, a silicon-germanium-on-insulator (SGOI) substrate, and/or a strained silicon (Si) substrate.

8. A method according to claim 1 further comprising:
after providing a mixture of the first and second gases adjacent the semiconductor substrate to etch the semiconductor substrate, forming an epitaxial semiconductor layer on the semiconductor substrate.

9. A method according to claim 8 wherein providing a mixture of the first and second gases adjacent the semiconductor substrate to etch the semiconductor substrate and forming the epitaxial semiconductor layer are performed in-situ in a same processing chamber.

10. A method according to claim 1 further comprising:
before providing the first and second gases, forming a gate structure on the semiconductor substrate, wherein providing the mixture of the first and second gases comprises providing the mixture of the first and second gases adjacent the semiconductor substrate to etch portions of the semiconductor substrate on opposite sides of the gate structure.

11. A method of forming a semiconductor device, the method comprising:
forming a gate structure on a semiconductor substrate;
forming source and drain regions of the semiconductor substrate on opposite sides of the gate structure; and
after forming the source and drain regions, etching exposed portions of the source and drain regions on opposite sides of the gate structure using a mixture of first and second gases, wherein the first gas is chemically reactive with respect to the semiconductor substrate wherein the second gas is different than the first gas, wherein a molecule of the second gas includes a hydrogen atom, and wherein the second gas lowers a temperature at which the first gas chemically reacts with the semiconductor substrate.

12. A method according to claim 11 further comprising:
after etching exposed portions of the source and drain regions, forming an epitaxial layer of a semiconductor material on the etched portions of the source and drain regions.

13. A method according to claim 12 wherein forming the epitaxial semiconductor layer comprises providing third and fourth gases wherein the third and fourth gases are different, wherein a molecule of the third gas includes an atom of the semiconductor material of the epitaxial layer and wherein the fourth gas is reactive with the semiconductor material to etch the semiconductor material.

14. A method according to claim 13 wherein the wherein the third gas comprises at least one of $GeH_4$, $SiH_4$, $Si_2H_6$, $SiH_2Cl_2$, $SiHCl_3$, $PH_3$, $B_2H_6$, and/or $AsH_3$, and wherein the fourth gas comprises at least one of HCl and/or HF.

15. A method according to claim 13 wherein the third gas comprises $GeH_4$ and wherein the fourth gas comprises HCl, and wherein a volume flow rate of HCl is less than about 18.5 times greater than a volume flow rate of $GeH_4$.

16. A method according to claim 13 wherein the third gas comprises $SiH_4$ and wherein the fourth gas comprises HCL, and wherein a volume flow rate of HCl is less than about 6 times greater than a volume flow rate of $SiH_4$.

17. A method according to claim 12 wherein etching exposed portions of the source and drain regions and forming an epitaxial semiconductor layer are performed in-situ in a same processing chamber.

18. A method according to claim 11 wherein the second gas accelerates a chemical decomposition of the first gas.

19. A method according to claim 11 wherein the semiconductor substrate comprises at least one of a silicon (Si) substrate, a germanium (Ge) substrate, a silicon-germanium (SiGe) substrate, a silicon-on-insulator (SOI) substrate, a silicon-germanium-on-insulator (SGOI) substrate, and/or a strained silicon (Si) substrate.

20. A method according to claim 11 wherein etching exposed portions of the source and drain regions comprises etching exposed portions of the source and drain regions at a temperature in the range of about 500 degrees C. to about 700 degrees C.

21. A method according to claim 11 wherein the first gas comprises at least one of HCl and/or HF, and wherein the second gas comprises at least one of $GeH_4$, $SiH_4$, $Si_2H_6$, $SiH_2Cl_2$, $SiHCl_3$, $PH_3$, $B_2H_6$, and/or $AsH_3$.

22. A method according to claim 11 wherein the first gas comprises HCl and the second gas comprises $GeH_4$, and wherein a volume flow rate of HCl is at least about 18.5 times greater than a volume flow rate of $GeH_4$.

23. A method according to claim 11 wherein the first gas comprises HCl and the second gas comprises $SiH_4$, and wherein a volume flow rate of HCl is at least about 6 times greater than a volume flow rate of $SiH_4$.

24. A method according to claim 11 further comprising:
    before forming the source and drain regions, forming spacers on sidewalls of the gate structure.

25. A method according to claim 11 wherein forming source and drain regions comprises implanting impurities into the semiconductor substrate on opposite sides of the gate structure.

* * * * *